United States Patent [19]

McDaniel

[11] Patent Number: 5,243,236
[45] Date of Patent: Sep. 7, 1993

[54] HIGH VOLTAGE CMOS SWITCH WITH PROTECTION AGAINST DIFFUSION TO WELL REVERSE JUNCTION BREAKDOWN

[75] Inventor: Bart R. McDaniel, Phoenix, Ariz.

[73] Assignee: Intel Corporation, Santa Clara, Calif.

[21] Appl. No.: 816,149

[22] Filed: Dec. 31, 1991

[51] Int. Cl.⁵ .................... H03K 17/16; H03K 19/01
[52] U.S. Cl. ............................... 307/443; 307/482.1; 307/451; 307/475
[58] Field of Search ............. 307/443, 475, 482.1, 307/465.1, 254, 571, 303, 304; 375/23.13, 23.8, 47

[56] References Cited

U.S. PATENT DOCUMENTS

| | | | |
|---|---|---|---|
| 4,039,869 | 8/1977 | Goldman et al. | 307/475 |
| 4,045,691 | 8/1977 | Asano | 307/475 |
| 4,161,663 | 7/1979 | Martinez | 307/475 |
| 5,157,281 | 10/1992 | Santin et al. | 307/303 |

*Primary Examiner*—Edward P. Westin
*Assistant Examiner*—Richard Roseen
*Attorney, Agent, or Firm*—Blakely, Sokoloff, Taylor & Zafman

[57] ABSTRACT

A high voltage CMOS n-well switch with guarding against reverse junction breakdown, as well as gate-aided breakdown. The CMOS switch of the present invention comprises two pairs of cascoding p-channel MOSFET loads, two pairs of cascoding n-channel MOSFET drivers and an inverter for input. One device in each pair of MOSFETs is used as a guard against gate-aided breakdown. The p-channel MOSFETs have independent n-wells so that the guard devices have their n-wells independently biased without being pulled by the n-wells of the load devices. The inverter is used to provide complementary inputs to the switch. By having independent n-wells, the breakdown voltage of the switch is raised above p+/n-well reverse breakdown voltage.

6 Claims, 8 Drawing Sheets

HIGH VOLTAGE CMOS SWITCH WITH PROTECTION AGAINST DIFFUSION TO WELL REVERSE JUNCTION BREAKDOWN

BACKGROUND OF THE INVENTION

1. Field of the Invention

The present invention is related to level-shifting switches used in programmable memories and specifically to high voltage CMOS level-shifting switches for those memories.

2. Art Background

In the field of memory devices such as EPROMs and EEPROMs, it is common to use a high voltage switch to achieve level shifting between voltage levels to activate the memories. A typical high voltage switch using the complementary metal oxide (CMOS) process is illustrated in FIG. 1. As shown in FIG. 1, the voltage Vpp represents the programming voltage for the PROM, which is typically 12 volts or higher. Input voltage Vin is applied to an n-channel MOSFET driver MN1 at its gate, while an inverted Vin is applied to the gate of another n-channel MOSFET driver MN2. Two p-channel MOSFET loads MP1 and MP2 are coupled between the n-channel MOSFET drivers MN1 and MN2 and the voltage Vpp. The gate of the p-channel MOSFET MP1 is connected to the drain nodes of transistors MP2 and MN2, which also forms the output voltage Vout. Similarly, the gate of the p-channel MOSFET MP2 is connected to the drain nodes of transistors MP1 and MN1, which becomes the complementary output voltage Vout-NOT.

Referring to FIG. 1, the operation of a typical CMOS switch is described as follows. When the input voltage Vin is low in the digital sense, the n-channel transistor MN1 is non-conducting. If the p-channel transistor MP1 is ON, the voltage level at Vout-NOT will tend to be pulled to Vpp, which continues to bias the p-channel transistor MP2 into an OFF state. As such, the voltage level at Vout will be pulled to low due to Vin-NOT at the gate of the n-channel transistor MN2. It would be apparent to those skilled in the art that the p-channel transistors should be sized to be weaker than the n-channel transistors to generate proper transitions. Typically, the n-channel transistors are fabricated to be at least twice as wide as the p-channel transistors.

A common problem known as gate-aided breakdown occurs at the junction edge of the CMOS switch shown in FIG. 1. The breakdown occurs in the p-channel transistors when the gate is biased towards a high potential of Vpp with the diffusion at either the drain or source being biased low. Similarly, the breakdown occurs in the n-channel transistors when the gate is biased towards a high negative potential with the diffusion being pulled positive high. The problem of gate-aided breakdown is typically prevented by having a cascode guard device in series with the switching devices as shown in the improved switch in FIG. 2.

Reference is now made to FIG. 2, where an n-well CMOS high voltage level-shifting switch is shown. As shown in FIG. 2, the p-channel guard devices 220 and 260 are connected in series with the p-channel switching devices 210 and 250, respectively. The n-channel guard devices 230 and 270 are connected in series with the n-channel switching devices 240 and 280, respectively. Input voltage at Vin 241 is typically 3 volts to 6 volts. A voltage Vmp 221 is applied to the gates of guard devices 220 and 260 as the gate bias for the guard devices. A voltage Vmn 231 is also applied to the gates of guard devices 230 and 270 as the gate bias voltage. Note that the p-channel devices 210 and 220, 250 and 260 have their wells coupled to Vpp 200, respectively. A cross-sectional view of the p-channel devices 250 and 260 from one side of the switch is shown in FIG. 3 to help illustrate another problem still associated with the conventional CMOS switch.

Referring to FIG. 3, when the gate 353 of device 350 is pulled to Vpp during switching, the p-channel device 350 is effectively shut off. Here, gate-aided breakdown 350 is already prevented by the voltage applied to the gate 363 of device 360. However, the drain 361 of device 360 is switched and pulled towards 0 volts, thus causing a reverse junction breakdown between p+ drain 361 and n-well 362 because n-well 362 is coupled to a high Vpp potential. For sub-micron devices, this reverse bias potential of (Vpp−Vss), or Vpp when Vss=0 volts, creates a serious problem for the devices.

As will be described in the following, the present invention provides an improved high voltage CMOS switch with guarding against reverse junction breakdown, as well as gate-aided breakdown.

SUMMARY OF THE INVENTION

Therefore, it is an object of the present invention to provide guarding against reverse junction breakdown from p+ source/drain diffusion to n-well junction in high voltage CMOS n-well switches.

It is another object of the present invention to provide guarding against gate-aided breakdown at the junction edge of the CMOS switches, as well as against reverse junction breakdown.

It is further an object of the present invention to provide guarding against reverse junction breakdown for high voltage CMOS switches with p-wells.

The present invention discloses a high voltage CMOS n-well switch with guarding against reverse junction breakdown, as well as gate-aided breakdown. The CMOS switch of the present invention comprises two pairs of cascoding p-channel MOSFET loads, two pairs of cascoding n-channel MOSFET drivers and an inverter for input. One device in each pair of MOSFETs is used as a guard against gate-aided breakdown. The p-channel MOSFETs have independent n-wells so that the guard devices have their n-wells independently biased without being pulled by the n-wells of the load devices. The inverter is used to provide complementary inputs to the switch. By having independent n-wells, the breakdown voltage of the switch is raised above the actual p+/n-well reverse junction breakdown voltage.

BRIEF DESCRIPTION OF THE DRAWINGS

Further objects, features and advantages of the present invention will become apparent from the following general description of the invention, wherein.

DETAILED DESCRIPTION OF THE INVENTION

An improved high voltage CMOS switch with guarding against reverse junction breakdown and gate-aided breakdown is disclosed. While the following description describes an n-well CMOS switch with complementing outputs, it would be apparent to those skilled in the art that a p-well CMOS switch can readily adapt the teachings of the present invention so that the breakdown voltage of the switch can be elevated above the n+source/drain diffusion to p-well junction breakdown voltage.

Figure 1:
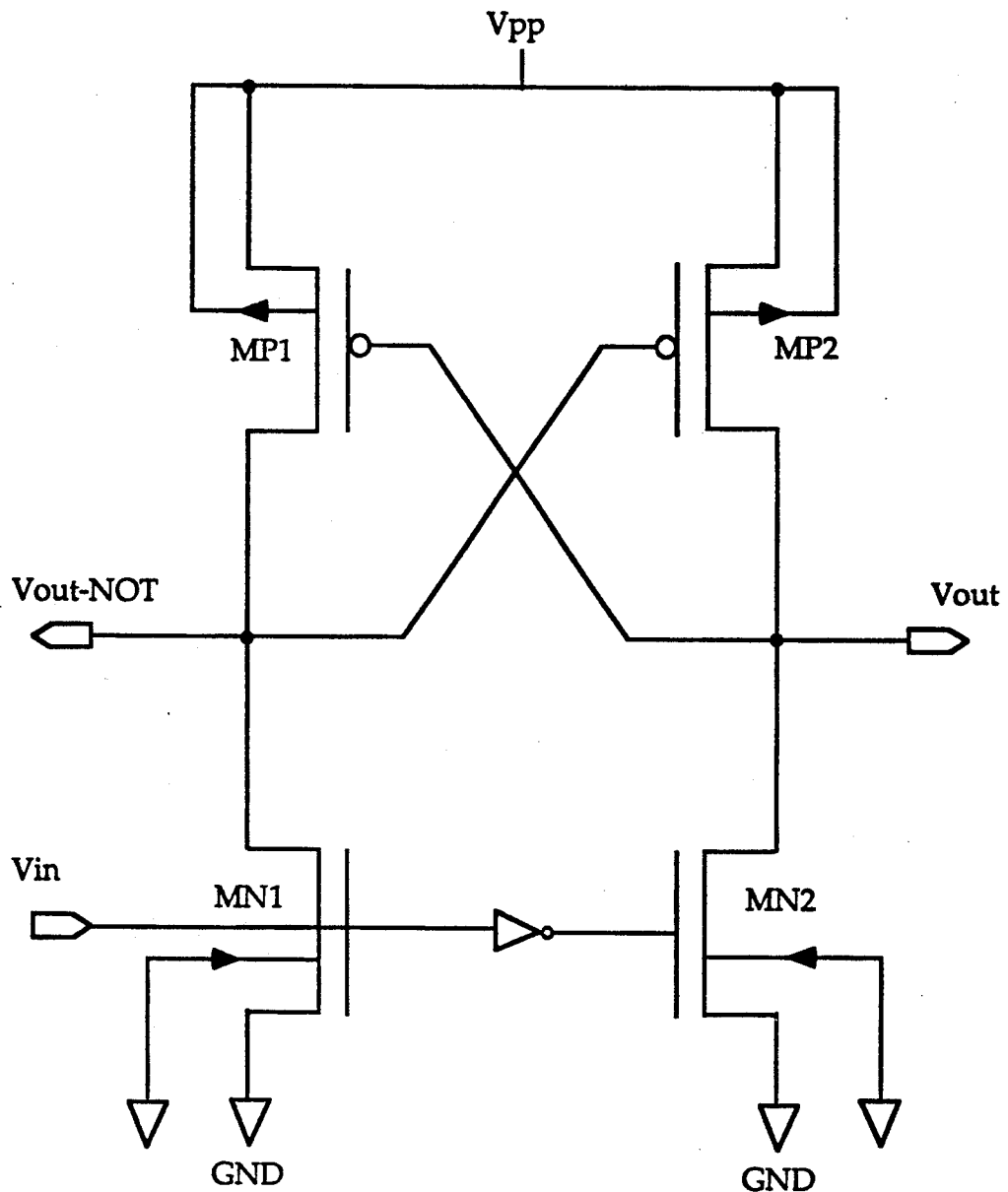
FIG. 1 is the schematic diagram of a typical high voltage CMOS switch.
Figure 2:
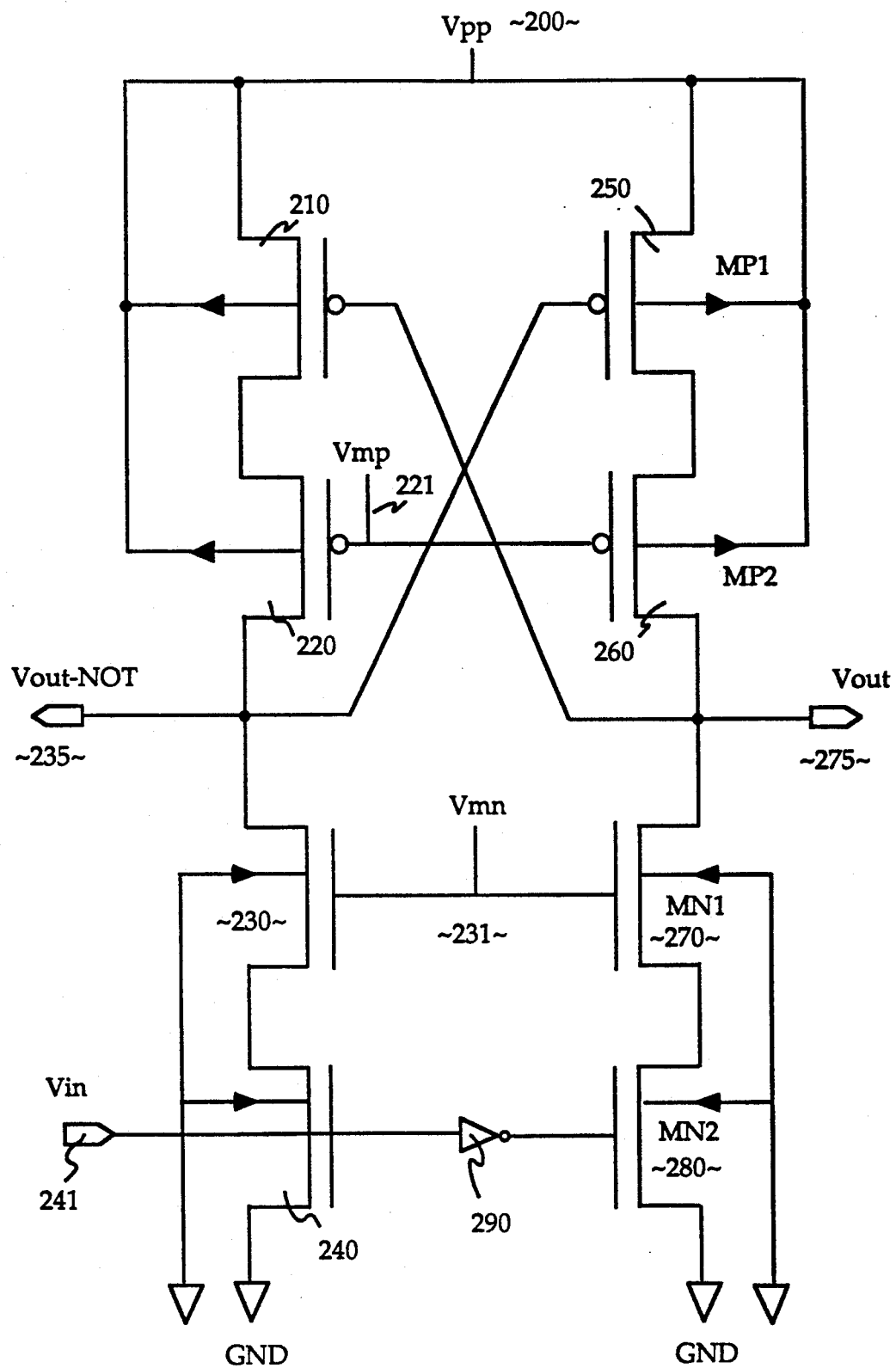
FIG. 2 is the schematic diagram of a high voltage n-well CMOS switch for shifting between voltage levels.
Figure 3:
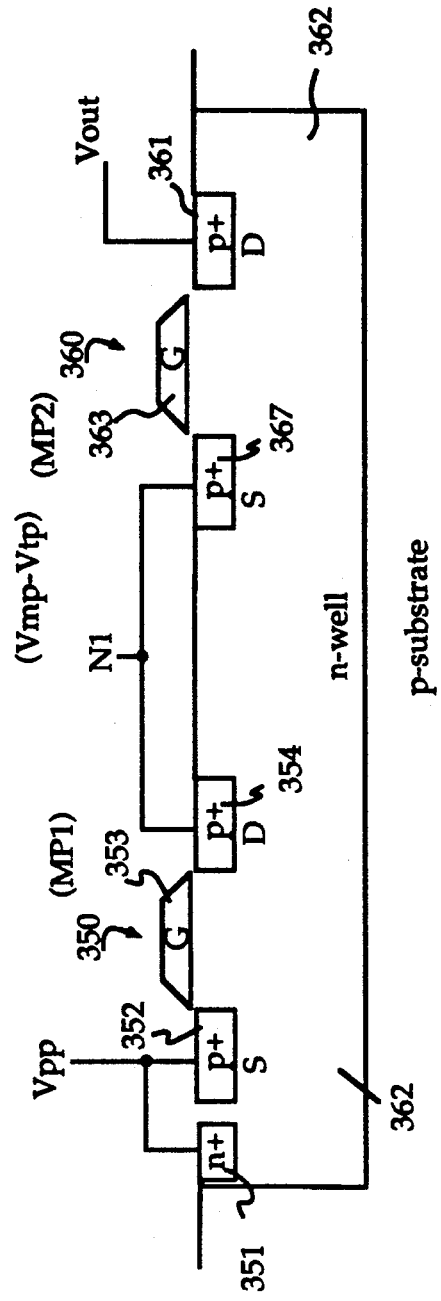
FIG. 3 is the cross-sectional view of the p-channel MOSFET devices from one stack of the CMOS switch.
Figure 4:
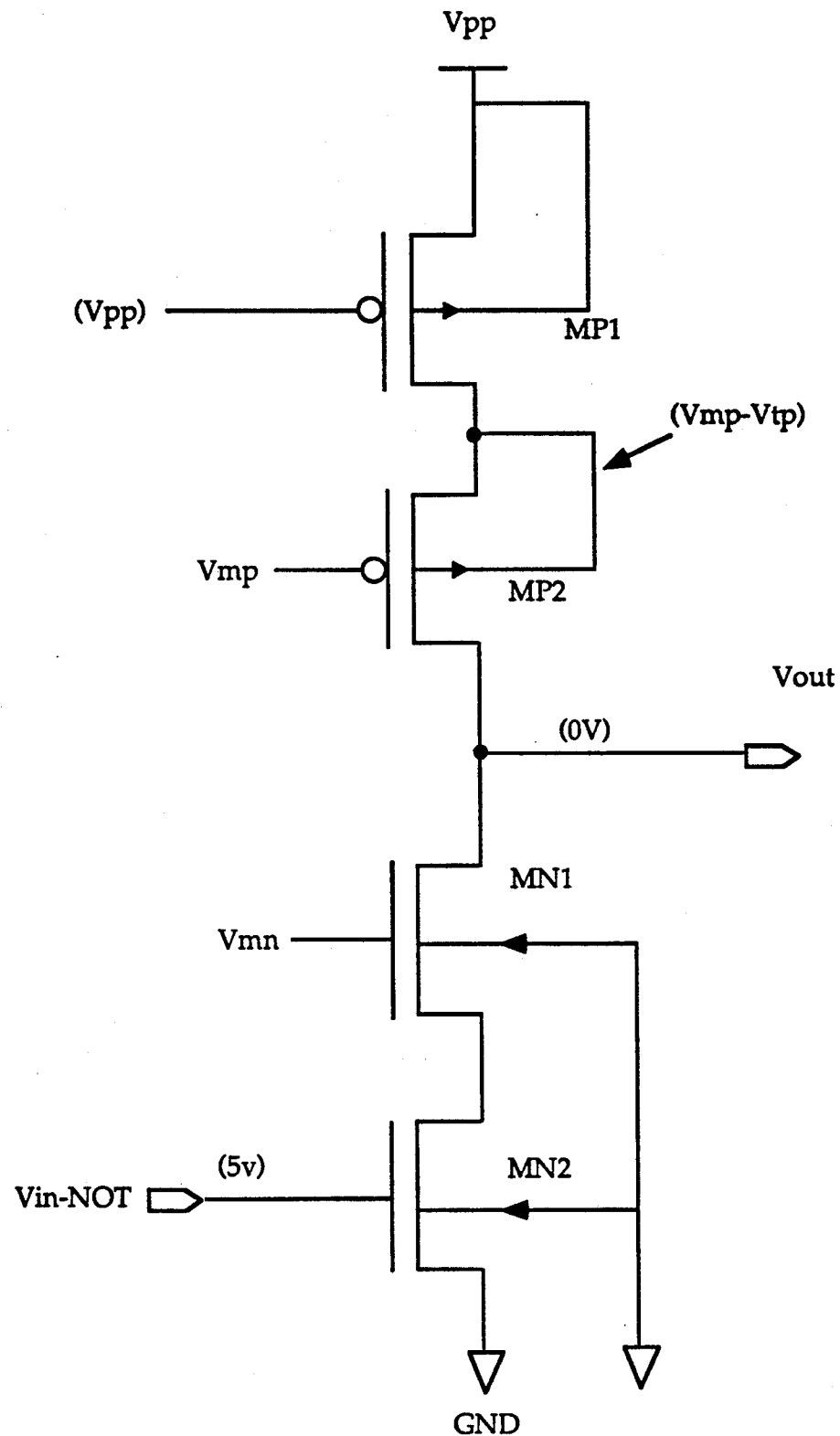
FIG. 4 is a simplified schematic diagram showing one stack of the CMOS n-well switch of the present invention.

Reference is now made to FIG. 4, where a single stack in the high voltage CMOS switch of the present invention is shown for the sake of simplicity. As shown in FIG. 4, a CMOS n-well buffer inverter according to the present invention includes a first p-channel MOSFET MP1 having its n-well and source coupled to a first predetermined voltage Vpp, wherein the first predetermined voltage Vpp is higher than the input voltage. A first n-channel MOSFET MN2 may have its gate coupled to the gate of the first p-channel MOSFET MP1 to receive an input voltage. A second p-channel MOSFET MP2 has its source coupled with the drain of the first p-channel MOSFET MP1, and serves as a cascode guard. The n-well of the second p-channel MOSFET MP2 is coupled to its source, and the gate of the second p-channel MOSFET MP2 is coupled to a second predetermined voltage Vmp biasing its gate.

A second n-channel MOSFET MN1 serves as a cascode guard, and has its drain coupled with the drain of the second p-channel MOSFET MP2 to form an output node Vout. The gate of the second n-channel MOSFET MN1 is coupled to a third predetermined voltage Vmn biasing its gate. The drain of the first n-channel MOSFET MN2 is coupled with the source of the second n-channel MOSFET MN1.

Figure 5:
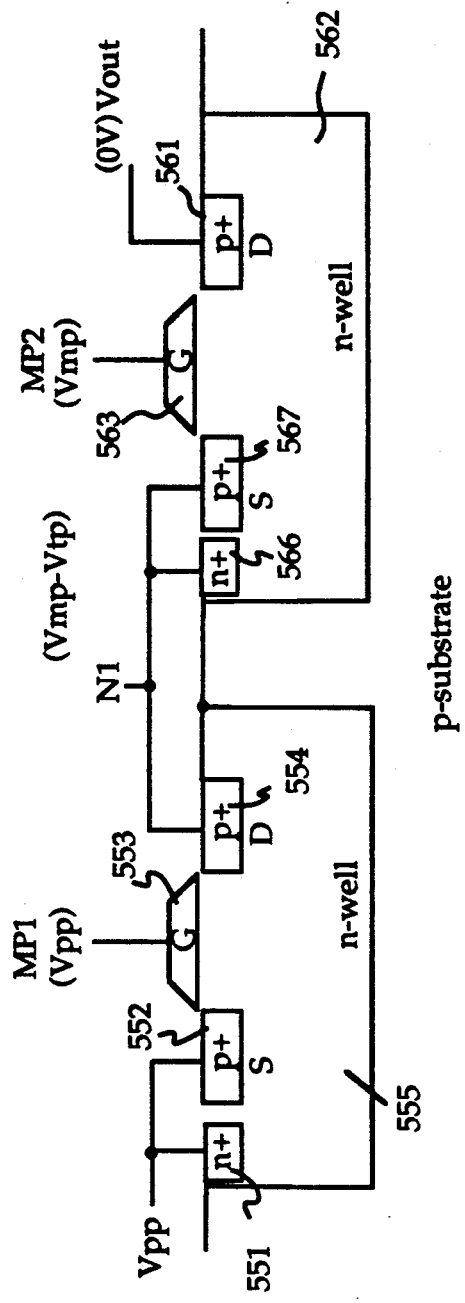
FIG. 5 is the simplified cross-sectional view showing one stack of the CMOS n-well switch of the present invention.

Because the two n-wells of devices MP1 and MP2 are independently formed, each n-well can be individually biased. A cross sectional view of the stack in FIG. 4 is shown in FIG. 5. Node N1 is formed by the p+diffusion 554 of device MP1, p+diffusion 567 and n-well 562 of device MP2 through n+contact 566. As shown in FIG. 5, n-wells 562 and 555 are formed independently and can be biased individually.

The operation of the CMOS switch of the present invention is described with reference to FIG. 4 as follows. When gate 553 of device MP1 is pulled high during switching, device MP1 is effectively shut off because MP1's gate-to-source voltage is 0 volts. The drain 561 of device MP2 experiences a drain potential of 0 volts (as node Vout is being pulled low) and a source potential of Vmp, which is the p-channel gate bias. Device MP2 is thus approaching the edge of conduction and pulling node N1 down to a potential of (Vmp−Vtp). As such, the potential of the n-well 562 is lowered from that of MP1 to (Vmp−Vtp). The reverse junction voltage between the drain 561 of device MP2 and n-well 562 becomes (Vmp−Vtp), instead of Vpp as in the single n-well case. It should be noted that in this n-well process, n+ source/drain to p-substrate in the n-channel devices and n-well to p-substrate reverse junction breakdown typically have higher voltage than the p+ source/drain to n-well reverse junction breakdown so as to obviate the need for a guard device for that purpose.

With the independently biased n-wells, the breakdown voltage of the CMOS switch is elevated above the normal p+/n-well reverse junction breakdown voltage. The present invention will ensure that the maximum reverse potential across the p+ diffusion to n-well junction of a p-channel switching device will be (Vpp−(Vmp−Vtp)), where Vmp is the gate potential of the p-channel guard device and Vtp is the p-channel threshold voltage. This is an improvement of (Vmp−Vtp) over the conventional switching device with common n-well in the p-channel devices, where the maximum reverse potential is Vpp. It should be noted that Vmp can be chosen to ensure the p-channel device to operate above the n+ source/drain to p-substrate breakdown potential.

Figure 6:
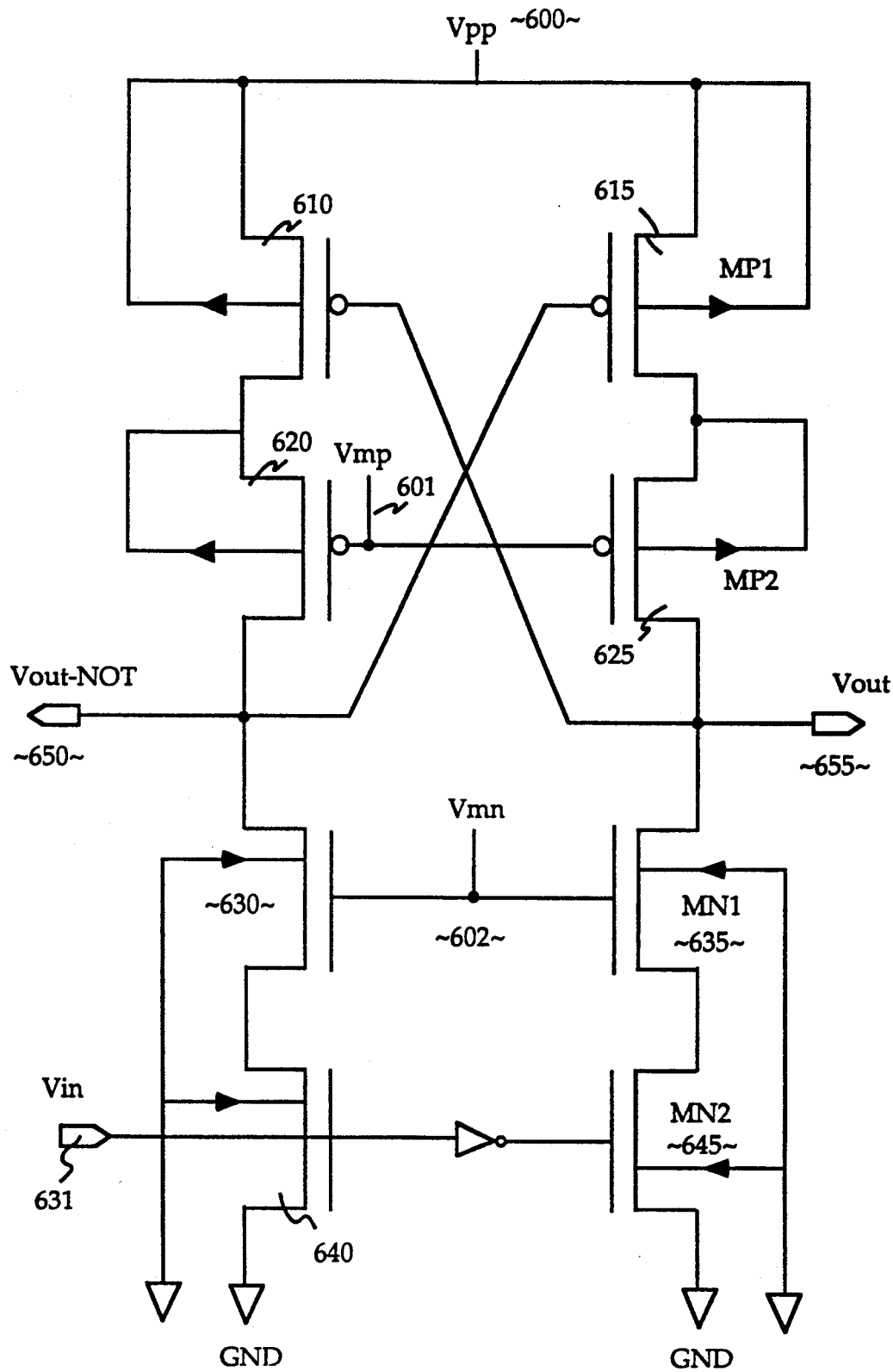
FIG. 6 is a schematic diagram showing the n-well CMOS high voltage switch incorporating the teachings of the present invention.

Reference is now made to FIG. 6, where an n-well CMOS high voltage level-shifting switch with p+ to n-well breakdown guarding is shown in its complete structure. In the figure, a CMOS n-well switch for providing level shifting in response to an input voltage 631 is shown including first and second p-channel MOSFETs 615 and 625, respectively. Each of the two p-channel MOSFETs 615 and 625 has an independent n-well. The source and n-well of the first p-channel MOSFET 615 are coupled to a first predetermined voltage Vpp shown at 600. The gate of the first p-channel MOSFET 615 forms a first node Vout-NOT shown at 650. The source and n-well of the second p-channel MOSFET 625 are coupled to the drain of the first p-channel MOSFET 615, and the drain of the second p-channel MOSFET 625 forms a second node Vout shown at 655.

Third and fourth p-channel MOSFETs 610 and 620, respectively, are shown in FIG. 6 having independent n-wells. The source and n-well of the third p-channel MOSFET 610 are coupled to the first predetermined voltage 600, and the gate of the third p-channel MOSFET 610 is coupled to the second node 655. The source and n-well of the fourth p-channel MOSFET 620 are coupled to the drain of the third p-channel MOSFET 610, and the drain of the fourth p-channel MOSFET 620 is coupled to the first node 650. The gates of the second and fourth p-channel MOSFETs 625, 620 are coupled to a second predetermined voltage Vmp shown at 601.

FIG. 6 also shows first, second, third and fourth n-channel MOSFETs 635, 645, 630, and 640, respectively, with the first and second 635, 645 being connected in cascode connection and the third and fourth 630, 640 being connected in cascode connection. The first n-channel MOSFET 635 is coupled at its drain to the second p-channel MOSFET 635 and to the second node 655. The third n-channel MOSFET 630 is coupled at the first node 650 to the fourth p-channel MOSFET 620. The third n-channel MOSFET 630 is coupled at its source to the drain of the fourth n-channel MOSFET 640.

The gates of the first and third n-channel MOSFETs 635, 630 are coupled to a third predetermined voltage Vmn shown at 602. The gate of the fourth n-channel MOSFET 640 is coupled to receive the input voltage 631, and the gate of the second n-channel MOSFET 645 is coupled to an inverter to receive the inverted input voltage.

In operation, input voltage Vin 631, typically at 3 to 6 volts, is applied to the gate of n-channel device 640 and the Vin-NOT 650 is applied to the gate of n-channel device 645. When Vin 631 is low, the n-channel device 640 is off. Both of the n-channel guard devices 630, 635 are turned on due to the gate bias voltage Vmn. The p-channel device 610 is pulled towards Vpp 600 as the n-channel device 645 is turned on by Vin-NOT 650, thus pulling node Vout 655 to ground. The complementary output node Vout-NOT 650 is also pulled up towards Vpp 600 through the p-channel devices 610, 620, while the p-channel device 615 is being turned off. Because the n-wells of p-channel devices 615, 625 are isolated from each other, the maximum reverse potential across the p+ diffusion to n-well junction of the p-channel device is Vpp−(Vmp−Vtp), which is quite an improvement from the Vpp in the conventional switches.

Figure 7:
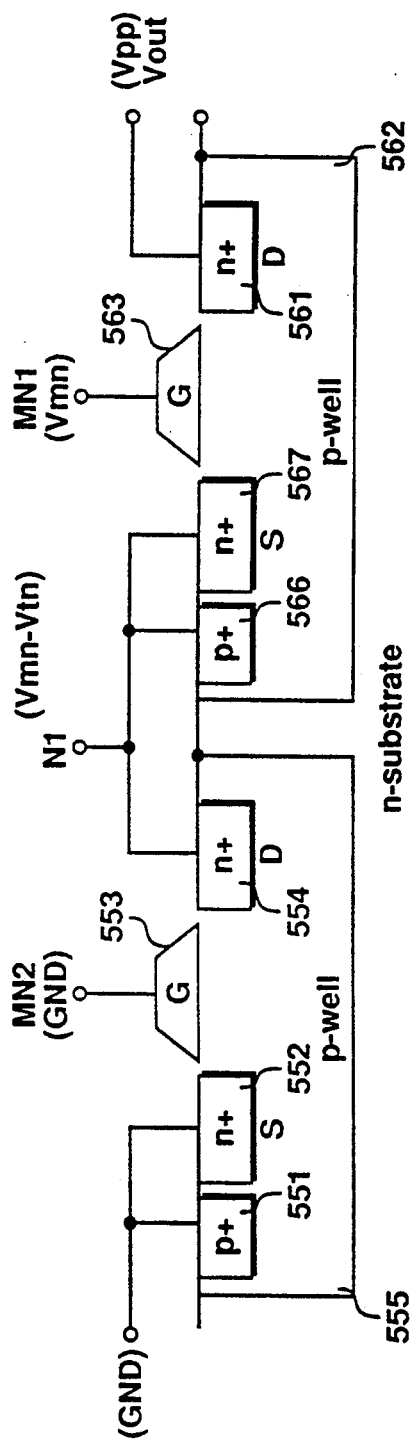
FIG. 7 is a cross-sectional view showing one stack of the CMOS p-well switch of the present invention.
Figure 8:
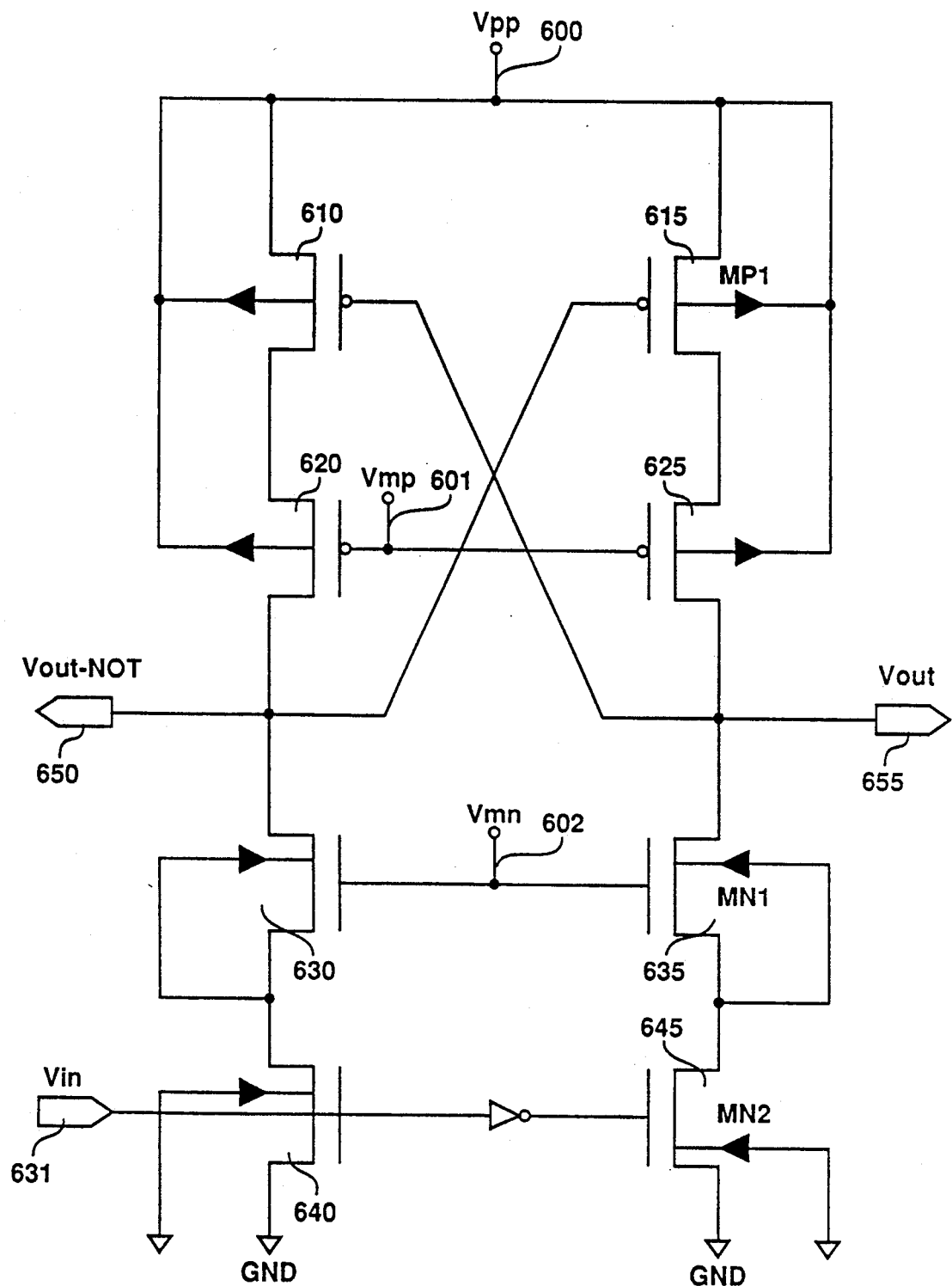
FIG. 8 is a schematic diagram showing the p-well CMOS high voltage switch incorporating the teachings of the present invention.

FIGS. 7 and 8 depict a CMOS p-well switch having similar reference numerals as are depicted for the CMOS n-well switch shown in FIGS. 5 and 6. A cross-section of the two MOSFETs MN1, MN2 of the CMOS p-well switch of FIG. 8 is shown in FIG. 7. The two n-channel MOSFETs MN1, MN2 have independently biased p-wells, as is shown in FIG. 7.

The configuration of the CMOS p-well switch of FIG. 8, which is able to provide level shifting in response to an input voltage Vin shown at 631, is now described. First, second, third and fourth p-channel MOSFETs are shown at 610, 620, 615, and 625, respectively. The first and second p-channel MOSFETs 610, 620 are configured in cascode connection such that the drain of the first p-channel MOSFET 610 is coupled to the source of the second p-channel MOSFET 620.

The third and fourth p-channel MOSFETs 615, 625 are cascode connected such that the drain of the third p-channel MOSFET 615 is coupled to the source of the fourth p-channel MOSFET 625. The gate of the first p-channel MOSFET 610 is coupled to the drain of the fourth p-channel MOSFET 625 to form an output node Vout shown at 655, and the gate of the third p-channel MOSFET 615 is coupled to the drain of the second p-channel MOSFET 620 to form an inverted output node Vout-NOT shown at 650. The gates of the second and fourth p-channel MOSFETs 620, 625 are coupled to a first predetermined gate bias voltage Vmp shown at 601.

A first and a second cascoding n-channel MOSFET are shown at 630 and 640, respectively, each having an independent p-well. The p-well of the first n-channel MOSFET 630 is coupled to its source and to the drain of the second n-channel MOSFET 640. The gate of the first n-channel MOSFET is coupled to a second predetermined gate bias voltage Vmn shown at 602. Third and fourth cascoding n-channel MOSFETs 635, 645 are shown having independent p-wells, wherein the p-well of the third n-channel MOSFET 635 is coupled to its source and to the drain of the fourth n-channel MOSFET 645. The gate of the third n-channel MOSFET 635 is coupled to the second predetermined gate bias voltage 602. The gate of the second n-channel MOSFET 640 is coupled to receive the input voltage 631, and the gate of the fourth n-channel MOSFET 645 is coupled to receive the inverted input voltage through an inverter.

Whereas many alterations and modifications of the present invention will no doubt become apparent to a person of ordinary skill in the art after having read the foregoing description, it is to be understood that the particular embodiments shown and described by way of illustration are in no way intended to be considered limiting. For example, it should be apparent from the above description that a buffer inverter using cascode p-channel and n-channel devices can easily incorporate independent n-wells to guard against reverse junction breakdown. Therefore, reference to the details of the presently preferred embodiment are not intended to limit the scope of the claims which themselves recite only those features regarded as essential to the invention.

I claim:

1. A CMOS n-well switch for providing level shifting in response to an input voltage, comprising:

first and second p-channel MOSFETs with independent n-wells, the source and n-well of said first p-channel MOSFET being coupled to a first predetermined voltage, the gate of said first p-channel MOSFET forming a first node, the source and n-well of said second p-channel MOSFET being coupled to the drain of said first p-channel MOSFET, the drain of said second p-channel MOSFET forming a second node;

third and fourth p-channel MOSFETs with independent n-wells, the source and n-well of said third p-channel MOSFET being coupled to said first predetermined voltage, the gate of said third p-channel MOSFET coupled to said second node, the source and n-well of said fourth p-channel MOSFET being coupled to the drain of said third p-channel MOSFET, the drain of said fourth p-channel MOSFET coupled to said first node, the gates of said second and fourth p-channel MOSFETs being coupled to a second predetermined voltage;

an inverter coupled to convert said input voltage;

first, second, third and fourth n-channel MOSFETs, said first and second being in cascode connection, said third and fourth being in cascode connection, said first n-channel MOSFET being coupled at its drain to said second p-channel MOSFET and to said second node, said third n-channel MOSFET being coupled at said first node to said fourth p-channel MOSFET and to the drain of said fourth n-channel MOSFET, the gates of said first and third n-channel MOSFETs being coupled to a third predetermined voltage, the gate of said fourth n-channel MOSFET being coupled to receive said input voltage, the gate of said second n-channel MOSFET being coupled to said inverter to receive the inverted input voltage from said inverter.

2. A CMOS n-well buffer inverter for inverting an input voltage with guarding devices against reverse junction breakdown, comprising:

a first p-channel MOSFET having its n-well and source coupled to a first predetermined voltage, said first predetermined voltage being higher than said input voltage;

a first n-channel MOSFET having its gate coupled to the gate of said first p-channel MOSFET to receive said input voltage;

a second p-channel MOSFET having its source coupled with the drain of said first p-channel MOSFET, the n-well of said second p-channel MOSFET being coupled to the source of said second p-channel MOSFET, the gate of said second p-channel MOSFET being coupled to a second predetermined voltage biasing its gate;

a second n-channel MOSFET having its drain coupled with the drain of said second p-channel MOSFET to form an output node, the gate of said second n-channel MOSFET being coupled to a third predetermined voltage biasing its gate, said drain of said first n-channel MOSFET being coupled with said source of said second n-channel MOSFET.

3. A CMOS p-well switch for providing level shifting in response to an input voltage, comprising:

first, second, third and fourth p-channel MOSFETs, said first and second being in cascode connection such that the drain of said first p-channel MOSFET is coupled to the source of said second p-channel MOSFET, said third and fourth being in cascode connection such that the drain of said third p-channel MOSFET is coupled to the source of said fourth p-channel MOSFET, the gate of said first p-channel MOSFET being coupled to the drain of said fourth p-channel MOSFET to form an output node, the gate of said third p-channel MOSFET being coupled to the drain of said second p-channel MOSFET to form an inverted output node, the gates of said second and fourth p-channel MOSFETs being coupled to a first predetermined gate bias voltage;

first and second cascoding n-channel MOSFETs with independent p-wells, the p-well of said first n-channel MOSFET being coupled to its source and to the drain of said second n-channel MOSFET, the gate of said first n-channel MOSFET being coupled to a second predetermined gate bias voltage;

an inverter coupled to receive said input voltage and to generate an inverted input voltage;

third and fourth cascoding n-channel MOSFETs with independent p-wells, the p-well of said third n-channel MOSFET being coupled to its source and to the drain of said fourth n-channel MOSFET, the gate of said third n-channel MOSFET being coupled to said second predetermined gate bias voltage, the gate of said second n-channel MOSFET being coupled to receive said input voltage, the gate of said fourth n-channel MOSFET being coupled to receive said inverted input voltage.

4. A CMOS p-well buffer inverter for inverting an input voltage with guarding devices against reverse junction breakdown, comprising:

a first p-channel MOSFET having its source coupled to a first predetermined voltage, said first predetermined being higher than said input voltage;

a first n-channel MOSFET having its gate coupled to the gate of said first p-channel MOSFET to receive said input voltage, said first n-channel MOSFET having its p-well and its source coupled to a second predetermined voltage;

a second p-channel MOSFET having its source coupled with said first p-channel MOSFET at the drain of said first p-channel MOSFET, the gate of said second p-channel MOSFET being coupled to a third predetermined voltage biasing its gate;

a second n-channel MOSFET having its drain coupled with the drain of said second p-channel MOSFET to form an output node, the gate of said second n-channel MOSFET being coupled to a fourth predetermined voltage biasing its gate, said second n-channel MOSFET having its p-well coupled to its source and to the drain of said first n-channel MOSFET.

5. A CMOS n-well switch according to claim 1, wherein said first, second, third, and fourth n-channel MOSFETs are ratioed to be stronger devices than said first, second, third, and fourth p-channel MOSFETs.

6. A CMOS n-well buffer according to claim 2, wherein said first and second n-channel MOSFETs are ratioed to be stronger devices than said first and second p-channel MOSFETs.

* * * * *

UNITED STATES PATENT AND TRADEMARK OFFICE
CERTIFICATE OF CORRECTION

PATENT NO. : 5,243,236
DATED : September 7, 1993
INVENTOR(S) : Bart R. McDaniel

It is certified that error appears in the above-indentified patent and that said Letters Patent is hereby corrected as shown below:

Col. 8, Line 14 and 15    After "predetermined"    Insert --voltage--

Signed and Sealed this

Eighteenth Day of October, 1994

Attest:

BRUCE LEHMAN

Attesting Officer    Commissioner of Patents and Trademarks